US010852358B2

(12) United States Patent
Endo et al.

(10) Patent No.: US 10,852,358 B2
(45) Date of Patent: Dec. 1, 2020

(54) BATTERY CAPACITY ESTIMATION DEVICE, METHOD AND PROGRAM

(71) Applicant: HONDA MOTOR CO., LTD., Tokyo (JP)

(72) Inventors: Hirotaka Endo, Wako (JP); Mitsumoto Kawai, Wako (JP); Tetsuya Koido, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/648,913

(22) PCT Filed: Jul. 11, 2018

(86) PCT No.: PCT/JP2018/026203
§ 371 (c)(1),
(2) Date: Mar. 19, 2020

(87) PCT Pub. No.: WO2019/064820
PCT Pub. Date: Apr. 4, 2019

(65) Prior Publication Data
US 2020/0284842 A1    Sep. 10, 2020

(30) Foreign Application Priority Data

Sep. 29, 2017   (JP) .................................. 2017-189395

(51) Int. Cl.
*G06F 11/30*       (2006.01)
*G01R 31/388*      (2019.01)
(Continued)

(52) U.S. Cl.
CPC .......... *G01R 31/388* (2019.01); *B60L 53/665* (2019.02); *B60L 58/12* (2019.02);
(Continued)

(58) Field of Classification Search
CPC .................................................... G01R 31/388
See application file for complete search history.

(56) References Cited

U.S. PATENT DOCUMENTS

| 2015/0268309 A1* | 9/2015 | Kim ..................... G01R 31/392 324/432 |
| 2015/0293183 A1* | 10/2015 | Tenmyo ................ H02J 7/0021 324/429 |

FOREIGN PATENT DOCUMENTS

| JP | 2001-257008 | 9/2001 |
| JP | 2004-172058 | 6/2004 |
| WO | 2014-083856 | 6/2014 |

OTHER PUBLICATIONS

International Search Report and Written Opinion for International Application No. PCT/JP2018/026203 dated Oct. 9, 2018, 8 pages.

* cited by examiner

*Primary Examiner* — Phuong Huynh
(74) *Attorney, Agent, or Firm* — Amin, Turocy & Watson, LLP

(57) ABSTRACT

This battery capacity estimation device is provided with: a condition variable acquisition unit which acquires standard variable values (Tstd, Istd, V1std, V2std) indicating a standard charging condition in a secondary battery and measurement variable values (Tmes, Imes, V1mes, V2mes) indicating an actual charging condition obtained by measurement; and a capacity estimation unit which estimates the maximum capacity from a relationship between the standard variable values and the measurement variables acquired by the condition variable acquisition unit, wherein the capacity estimation unit calculates an apparent capacity (ΔQmes/ΔSOC) by using a uniform calculation method regardless of a change in charging condition, and estimates the maximum capacity (Qmax) by adding, to the apparent capacity, a (Continued)

correction amount obtained by using the differences between the measurement variables and the standard variables.

7 Claims, 12 Drawing Sheets

(51) Int. Cl.
    *G01R 31/367*     (2019.01)
    *B60L 53/66*     (2019.01)
    *G01R 31/36*     (2020.01)
    *G01R 31/374*     (2019.01)
    *B60L 58/12*     (2019.01)
(52) U.S. Cl.
    CPC ....... *G01R 31/367* (2019.01); *G01R 31/3648* (2013.01); *G01R 31/374* (2019.01)

| | |
|---|---|
| USER INFORMATION | USER ID |
| | PERSONAL INFORMATION |
| | MODEL OF VEHICLE |
| | USAGE POLICY |
| BATTERY RENTAL INFORMATION | RENTAL DATE AND TIME |
| | SLOT ID |
| | BATTERY ID |
| BATTERY RETURN INFORMATION | RETURN DATE AND TIME |
| | SLOT ID |
| | BATTERY ID |
| | USAGE HISTORY INFORMATION |
| BILLING DETAILS INFORMATION | BILLING DATE AND TIME |
| | BILLING UNIT PRICE |
| | AMOUNT OF POWER USED |
| | BILLING AMOUNT |

| | |
|---|---|
| BATTERY ID | |
| BATTERY TYPE | |
| STANDARD CHARGING CONDITIONS | TEMPERATURE Tstd |
| | CURRENT Istd |
| | STARTING VOLTAGE V1std |
| | ENDING VOLTAGE V2std |
| CAPACITY ESTIMATION INFORMATION | CAPACITY DEVIATION ΔQref |
| | STATE-OF-CHARGE DEVIATION ΔSOC |
| | TEMPERATURE CORRECTION COEFFICIENT At |
| | CURRENT CORRECTION COEFFICIENT Ac |
| | STARTING VOLTAGE CORRECTION COEFFICIENT Av1 |
| | ENDING VOLTAGE CORRECTION COEFFICIENT Av2 |
| BATTERY EVALUATION INFORMATION | EVALUATION DATE AND TIME |
| | ACTUAL CHARGING CONDITIONS |
| | MAXIMUM CAPACITY Qmax |
| | ACCEPTANCE/NON-ACCEPTANCE DETERMINATION RESULT |

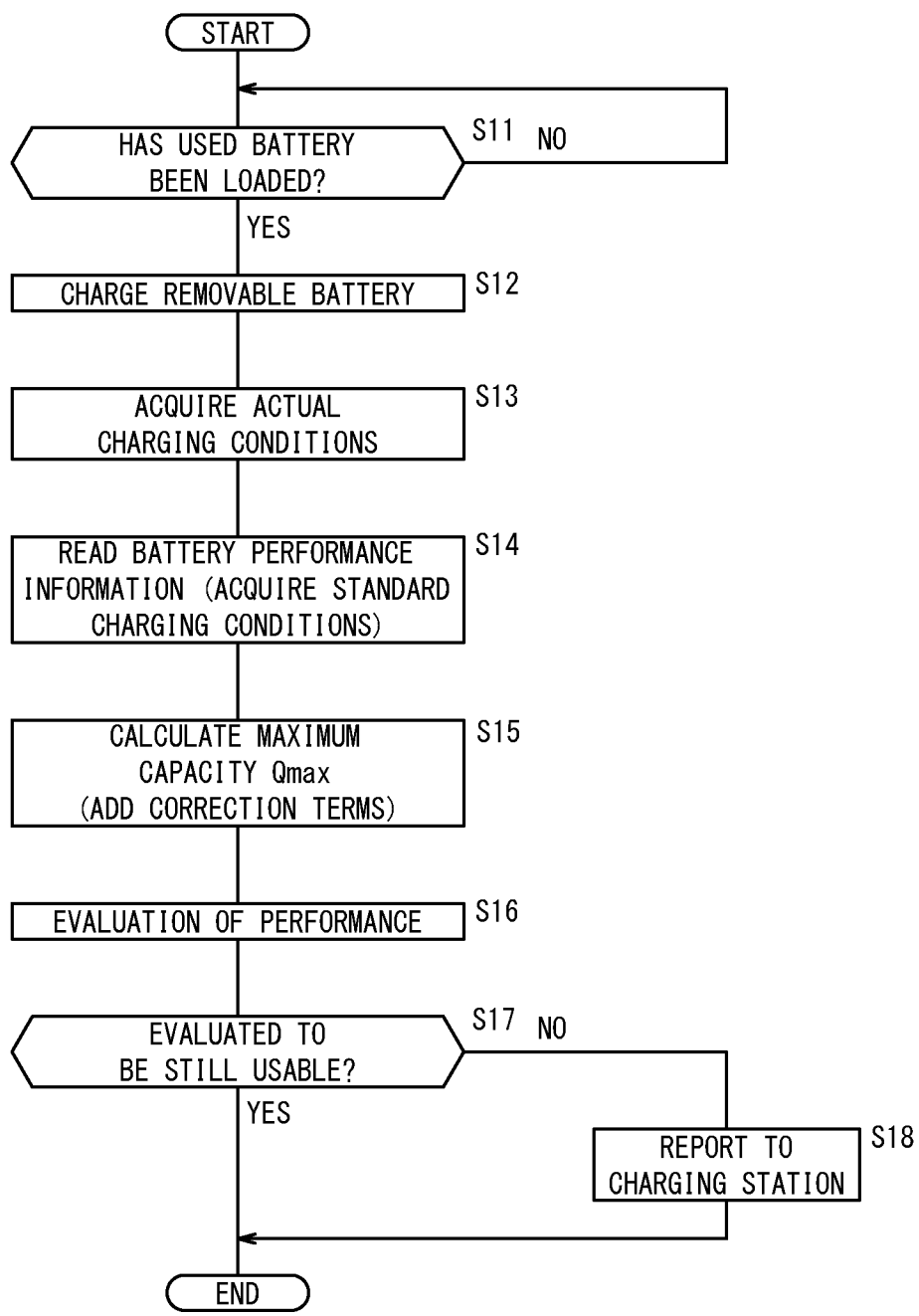

BATTERY CAPACITY ESTIMATION DEVICE, METHOD AND PROGRAM

TECHNICAL FIELD

The present invention relates to a battery capacity estimation device, method, and program for estimating a maximum capacity of a secondary battery.

BACKGROUND ART

Techniques for estimating the maximum capacity of secondary batteries, including lithium-ion batteries, and determining the state of battery deterioration are conventionally known (for example, see Japanese Laid-Open Patent Publication No. 2001-257008 ([0021], [0022], etc.))

SUMMARY OF INVENTION

However, the estimation method proposed in Japanese Laid-Open Patent Publication No. 2001-257008 ([0021], [0022], etc.) does not consider a situation in which actual charging conditions deviate from standard charging conditions to a nonnegligible extent when a secondary battery is charged in an environment that differs from the intended usage environment. For example, when the state of deterioration of a secondary battery is judged from a relationship with the maximum capacity (reference value) obtained when a brand-new secondary battery is charged under standard charging conditions, there is a problem that the accuracy of judgement of deterioration varies.

The present invention has been devised in order to solve the problem above, and an object of the present invention is to provide a battery capacity estimation device, method, and program that can highly accurately estimate the maximum capacity of a secondary battery, taking into account the deviation of charging conditions.

A battery capacity estimation device according to a first aspect of the present invention is a device configured to estimate a maximum capacity of a secondary battery that has been charged under a charging condition that is specified by one or more condition variables, the device including: a condition variable acquisition unit configured to acquire a standard variable value that indicates a standard charging condition for the secondary battery and a measurement variable value that indicates an actual charging condition obtained by measurement; and a capacity estimation unit configured to estimate the maximum capacity from a relationship between the standard variable value and the measurement variable value acquired by the condition variable acquisition unit, wherein the capacity estimation unit calculates an apparent capacity using a uniform calculation method irrespective of change in the charging condition, and estimates the maximum capacity by adding, to the apparent capacity, a correction quantity obtained by using a deviation between the measurement variable value and the standard variable value.

In this way, the maximum capacity is estimated by adding a correction quantity obtained by using a deviation between the measurement variable value and the standard variable value, to the apparent capacity calculated using a uniform calculation method irrespective of change in the charging condition. It is therefore possible to appropriately correct variation of the maximum capacity that is due to the deviation of charging conditions and thus to estimate the maximum capacity of the secondary battery highly accurately.

The capacity estimation unit may estimate the maximum capacity based on a calculation equation that is obtained by regarding the maximum capacity as a function of the condition variable and performing a Taylor expansion of the function around the standard variable value. Expressing the maximum capacity as a polynomial of deviation(s) enables the maximum capacity to be estimated by relatively simple calculation.

The capacity estimation unit may estimate the maximum capacity by adding a first-order correction quantity that is proportional to the deviation between the measurement variable value and the standard variable value. Owing thereto, it is possible to achieve high estimation accuracy even with a simplest calculation equation.

The condition variable may be at least one of a temperature, a current, a starting voltage, and an ending voltage. It is thus possible to acquire condition variable(s) by using a measurement sensor that is generally provided to control charging and discharging of the secondary battery.

The secondary battery may be a lithium-ion battery. Lithium-ion batteries have relatively high dependence on the environment as compared to batteries of other types, and therefore the above advantageous effects in correcting the variation becomes more remarkable.

A battery capacity estimation method according to a second aspect of the present invention is a method for estimating a maximum capacity of a secondary battery that has been charged under a charging condition that is specified by one or more condition variables, wherein one or a plurality of computers are configured to execute: an acquisition step of acquiring a standard variable value that indicates a standard charging condition for the secondary battery and a measurement variable value that indicates an actual charging condition obtained by measurement; and an estimation step of estimating the maximum capacity from a relationship between the acquired standard variable value and the acquired measurement variable value, wherein the estimation step calculates an apparent capacity using a uniform calculation method irrespective of change in the charging condition, and estimates the maximum capacity by adding, to the apparent capacity, a correction quantity obtained by using a deviation between the measurement variable value and the standard variable value.

A battery capacity estimation program according to a third aspect of the present invention is a program for estimating a maximum capacity of a secondary battery that has been charged under a charging condition that is specified by one or more condition variables, wherein the program causes one or a plurality of computers to execute: an acquisition step of acquiring a standard variable value that indicates a standard charging condition for the secondary battery and a measurement variable value that indicates an actual charging condition obtained by measurement; and an estimation step of estimating the maximum capacity from a relationship between the acquired standard variable value and the acquired measurement variable value, wherein the estimation step calculates an apparent capacity using a uniform calculation method irrespective of change in the charging condition, and estimates the maximum capacity by adding, to the apparent capacity, a correction quantity obtained by using a deviation between the measurement variable value and the standard variable value.

According to the battery capacity estimation device, method, and program of the present invention, it is possible to highly accurately estimate the maximum capacity of a secondary battery, taking into account the deviation of charging conditions.

BRIEF DESCRIPTION OF DRAWINGS

FIG. 3 is a diagram showing an example of data structure of service usage information;

FIG. 4 is a diagram showing an example of data structure of battery performance information;

FIG. 11 is a flowchart regarding capacity estimation of an electric storage unit.

DESCRIPTION OF EMBODIMENTS

The battery capacity estimation device according to the present invention will now be described while referring to the accompanying drawings in conjunction with preferred embodiments, in relation to the battery capacity estimation method and battery capacity estimation program.

[Configuration of Electric Power Billing System 10]

<Overall Configuration>

Figure 1:
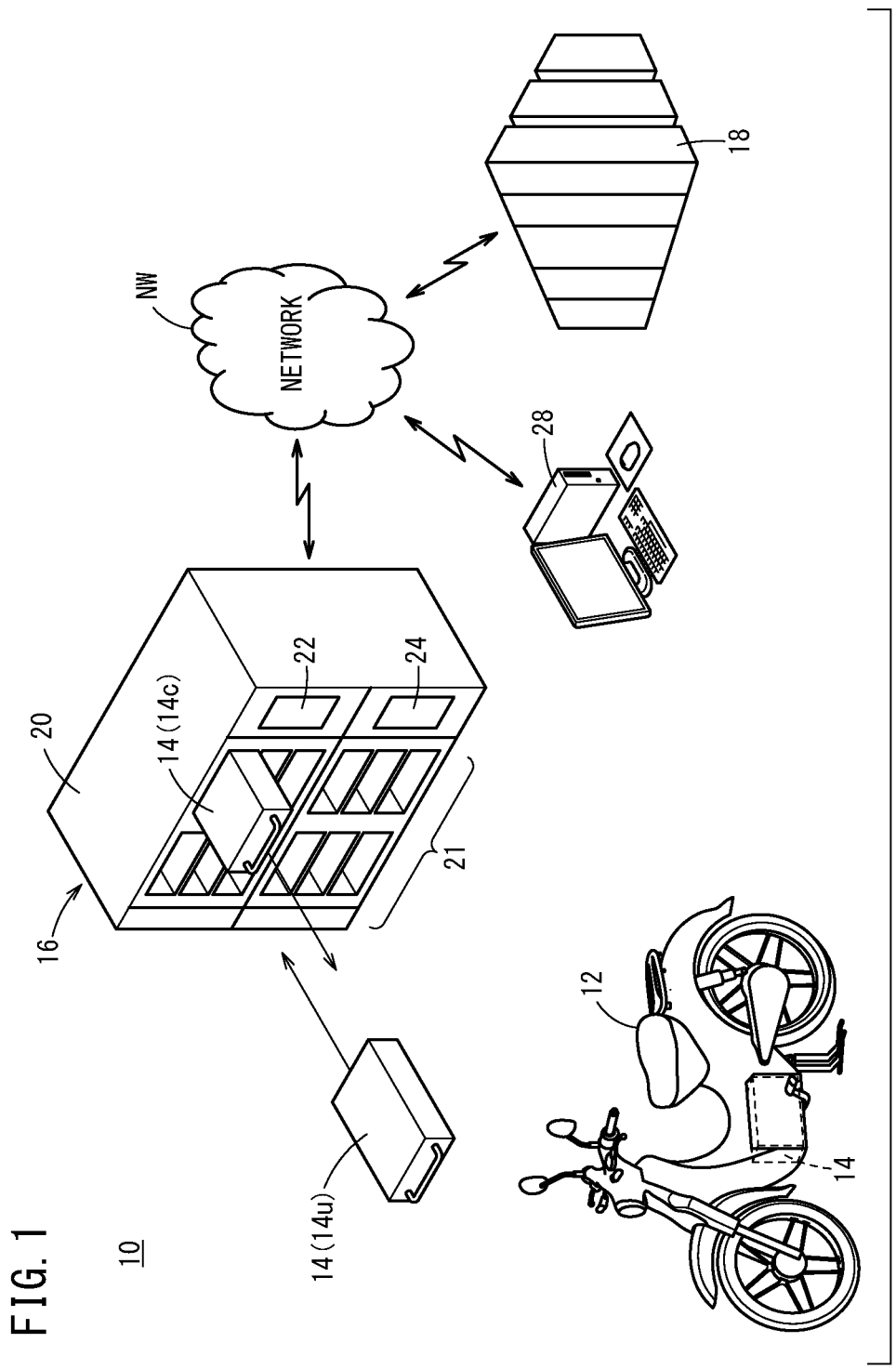
FIG. 1 is an overall configuration diagram illustrating an electric power billing system incorporating a battery capacity estimation device according to an embodiment of the present invention.
Figure 2:
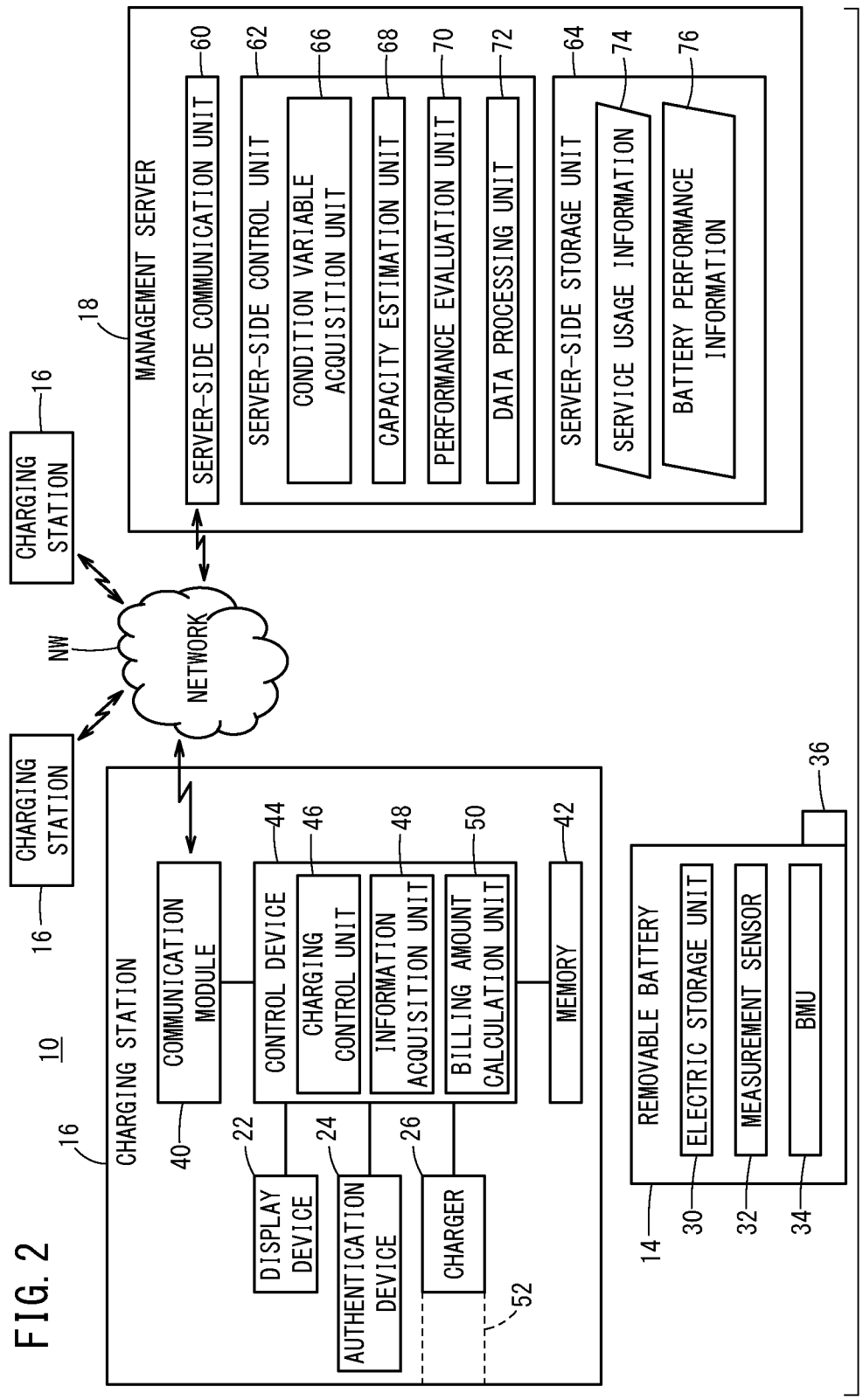
FIG. 2 is a block diagram illustrating the electric power billing system shown in FIG. 1.

FIG. 1 is an overall configuration diagram illustrating an electric power billing system 10 incorporating a battery capacity estimation device of one embodiment of the present invention. FIG. 2 is a block diagram of the electric power billing system 10 shown in FIG. 1.

As shown in FIG. 1, the electric power billing system 10 is a system that can provide a battery sharing service in which multiple users share removable batteries 14 as driving source of saddle-riding type motorcycles 12 (electric vehicles). Basically, this electric power billing system 10 includes one or more removable batteries 14, one or more charging stations 16, and a management server 18 serving as the battery capacity estimation device.

The removable battery 14 is a cassette-type electric storage device that is removably mounted in the motorcycle 12 that can run by at least electric power. For the sake of convenience of explanation, a removable battery 14 that requires charging may hereinafter be referred to as a "used (spent) battery 14u" and a removable battery 14 that has been recharged may hereinafter be referred to as a "recharged battery 14c" so that they can be distinguished from each other.

The charging station 16 is an apparatus for storage and recharging of one or more removable batteries 14, and a plurality of charging stations 16 are provided at a plurality of places. The charging station 16 has a casing 20 including a slot unit 21 having multiple (12 in this example) slots, a display device 22, and an authentication device 24. The slot unit 21 has, provided on a depth side thereof, chargers 26 (FIG. 2) that can charge the removable batteries 14.

The charging station 16 is communicably connected to the management server 18 through a network NW. A working computer 28 is also communicably connected to the management server 18 through the network NW. The charging station 16 (or the working computer 28) can thus send and receive communication data to and from the management server 18 through the network NW.

<Configuration of Removable Battery 14>

As shown in FIG. 2, specifically, the removable battery 14 includes an electric storage unit 30, a measurement sensor 32, a battery management unit (hereinafter referred to as BMU 34), and a connection unit 36.

The electric storage unit 30 is a battery core pack that includes a secondary battery (a lithium-ion battery or lead storage battery), which is configured to charge and discharge electric power. The electric storage unit 30 may be configured in other ways, and may include a secondary battery of other type, or capacitor, or can be a composite battery including a combination thereof.

The measurement sensor 32 is composed of various sensors for measuring temperature T, current I or voltage V of the electric storage unit 30. Accordingly, the measurement sensor 32 can acquire information indicating a history of usage environment or usage condition while being mounted in the motorcycle 12 (hereinafter the information will be referred to as usage history information). The measurement sensor 32 can also measure actual charging conditions during charging operation of the electric storage unit 30.

The BMU 34 includes a CPU (Central Processing Unit), and RAM (Random Access Memory), for example, and is a device configured to control charging and discharging of the electric storage unit 30. Further, the BMU 34 can store identification information of the removable battery 14 (hereinafter referred to as battery ID), identification information of the user (hereinafter referred to as user ID), and the usage history information from the measurement sensor 32.

Examples of the usage history information can be internal temperature during charging or discharging, voltage during discharging, time-series data of state of charge (SOC), electricity usage amount from rental to return, usage period from rental to return, travel distance from rental to return, or total electricity usage amount, total usage period, total travel distance.

<Configuration of Charging Station 16>

Specifically, the charging station 16 includes the display device 22, authentication device 24, charger 26, a communication module 40, a memory 42, and a control device 44.

The display device 22 is a device that has at least a display function, which may include a touchscreen panel (a display panel with touch sensors), for example. The display device 22 can thus enable input of necessary information in accordance with an operation made by a user and can also provide various visible information to the user.

The authentication device 24 is a device that, by employing Near Field Communication (NFC), for example, reads information recoded on an NFC card (not shown) carried by the user. The charging station 16 can thus authenticate a user having access to the sharing service, by using user ID contained in the recorded information.

The charger 26 is a device that charges the removable battery 14 through the connection units 36 and 52 being connected to each other. A power supply (not shown) for supplying electric power to the removable battery 14 is connected to the charger 26.

The communication module 40 is a module that can communicate with external equipment by wire or wirelessly. Accordingly, the charging station 16 can send and receive various data concerning the sharing service to and from the management server 18.

The memory 42 is a nonvolatile memory composed of EEPROM (Electrically Erasable Programmable Read-Only Memory), or flash memory, for example. Accordingly, it is possible to store information concerning each removable battery 14 stored in the charging station 16.

The control device 44 includes a CPU or MPU, for example. The control device 44 reads and executes a program stored in the memory 42 to function as a charging control unit 46, an information acquisition unit 48, and a billing amount calculation unit 50.

<Configuration of Management Server 18>

The management server 18 is a computer that includes a server-side communication unit 60, a server-side control unit 62, and a server-side storage unit 64.

The server-side communication unit 60 is an interface configured to send and receive electric signals to and from external equipment. This enables the management server 18 to send and receive various kinds of data (e.g., part of the service usage information 74) concerning the sharing service to and from the charging station 16.

The server-side control unit 62 includes a CPU or MPU and reads and executes a program stored in the server-side storage unit 64 to function as a condition variable acquisition unit 66, a capacity estimation unit 68, a performance evaluation unit 70, and a data processing unit 72.

The server-side storage unit 64 is composed of a non-transitory storage device such as an internal hard disk drive or external hard disk in the computer system, for example. Accordingly, the server-side storage unit 64 has configured therein a database concerning information indicating the state of use of the sharing service (hereinafter, the service usage information 74) and information indicating the electric storage performance of the removable batteries 14 (hereinafter referred to as battery performance information 76).

<Data Structure of Service Usage Information 74>

FIG. 3 is a diagram showing an example of the data structure of the service usage information 74. The service usage information 74 includes user information, battery rental information, battery return information, and billing details information.

The "user information" is information about users of the sharing service. The user information includes user ID, personal information (e.g., name, address, payment method), model of vehicle (model of the motorcycle 12), and usage policy (e.g., service plans), for example.

The "battery rental information" is information concerning removable batteries 14 that have been taken out of the charging station 16 (i.e., rented, recharged batteries 14*c*). The battery rental information includes rental date and time, slot ID, and battery ID, for example.

The "battery return information" is information concerning removable batteries 14 that have been set in the charging station 16 (i.e., returned, used batteries 14*u*). The battery return information includes return date and time, slot ID, battery ID, and usage history information, for example.

The "billing details information" is information that indicates billing details of each user. The billing details information includes billing date and time, billing unit price, amount of electric power used, and billing amount, for example.

<Data Structure of Battery Performance Information 76>

FIG. 4 is a diagram showing an example of the data structure of the battery performance information 76. The battery performance information 76 includes battery ID, battery type, standard charging conditions, capacity estimation information, and battery evaluation information.

The "standard charging conditions" are standard conditions for charging the electric storage unit 30, and the conditions are specified by one or more condition variables. The condition variables include temperature Tstd, current Istd, starting voltage V1std, and ending voltage V2std, for example. Values of the variables indicating the standard charging conditions may hereinafter be referred to as "standard variable values".

The "capacity estimation information" includes one or more parameters for estimating a maximum capacity (Qmax) of the electric storage unit 30. The parameters include capacity deviation $\Delta Qref$, state-of-charge deviation $\Delta SOC$, temperature correction coefficient At, current correction coefficient Ac, starting voltage correction coefficient Av1, and ending voltage correction coefficient Avg, for example.

The "battery evaluation information" is information indicating the results of evaluation of the electric storage unit 30. The battery evaluation information includes evaluation date and time, actual charging conditions, maximum capacity Qmax, and the result of acceptance/non-acceptance determination.

The "actual charging conditions" are actual charging conditions that are obtained by measurement of the electric storage unit 30, and which are specified by one or more condition variables. The condition variables include temperature Tmes, current Imes, starting voltage V1mes, and ending voltage V2mes, for example. Values of the variables indicating the actual charging conditions may hereinafter be referred to as "measurement variable values".

[Operations of Management Server 18]

The management server 18 serving as the battery capacity estimation device of this embodiment is configured as described above. Next, operations of the management server 18 will be described referring to FIGS. 5 to 12. More specifically, operations regarding a preparation for the capacity estimation will be described using the flowchart of FIG. 5, and operations regarding the capacity estimation of the electric storage unit 30 will be described using the flowchart of FIG. 11.

<Preparation for Capacity Estimation>

Figure 5:
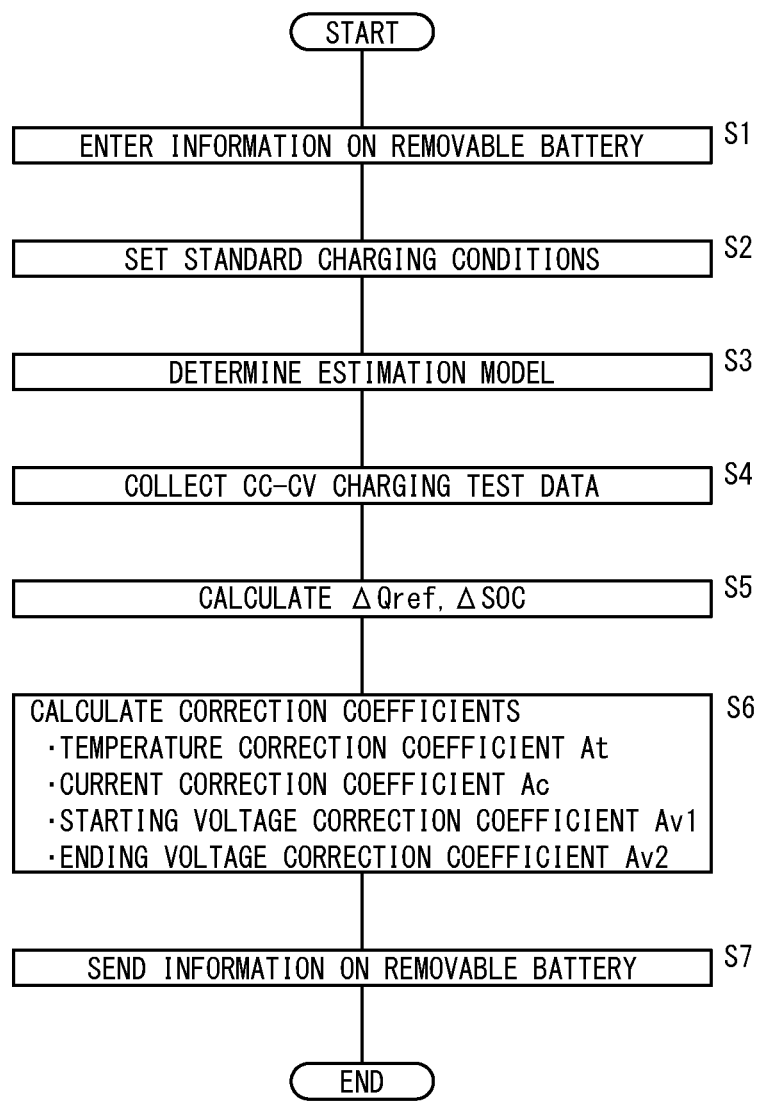
FIG. 5 is a flowchart regarding a preparation for capacity estimation.

At step S1 of FIG. 5, the working computer 28 inputs information about a brand-new removable battery 14 (e.g., battery ID, battery type). This removable battery 14 is a battery that has not yet been brought onto market and is going to be used for the sharing service from now.

At step S2, the working computer 28 sets standard charging conditions that are suitable for the battery type inputted at step S1 (i.e., standard charging conditions). It is assumed that, as a result, settings have been made such that temperature T=Tstd, current I=Istd, starting voltage V=V1std, and ending voltage V=V2std.

At step S3, the working computer 28 determines a mathematical model for estimating the maximum capacity Qmax of the electric storage unit 30 (hereinafter referred to as an estimation model).

Figure 6:
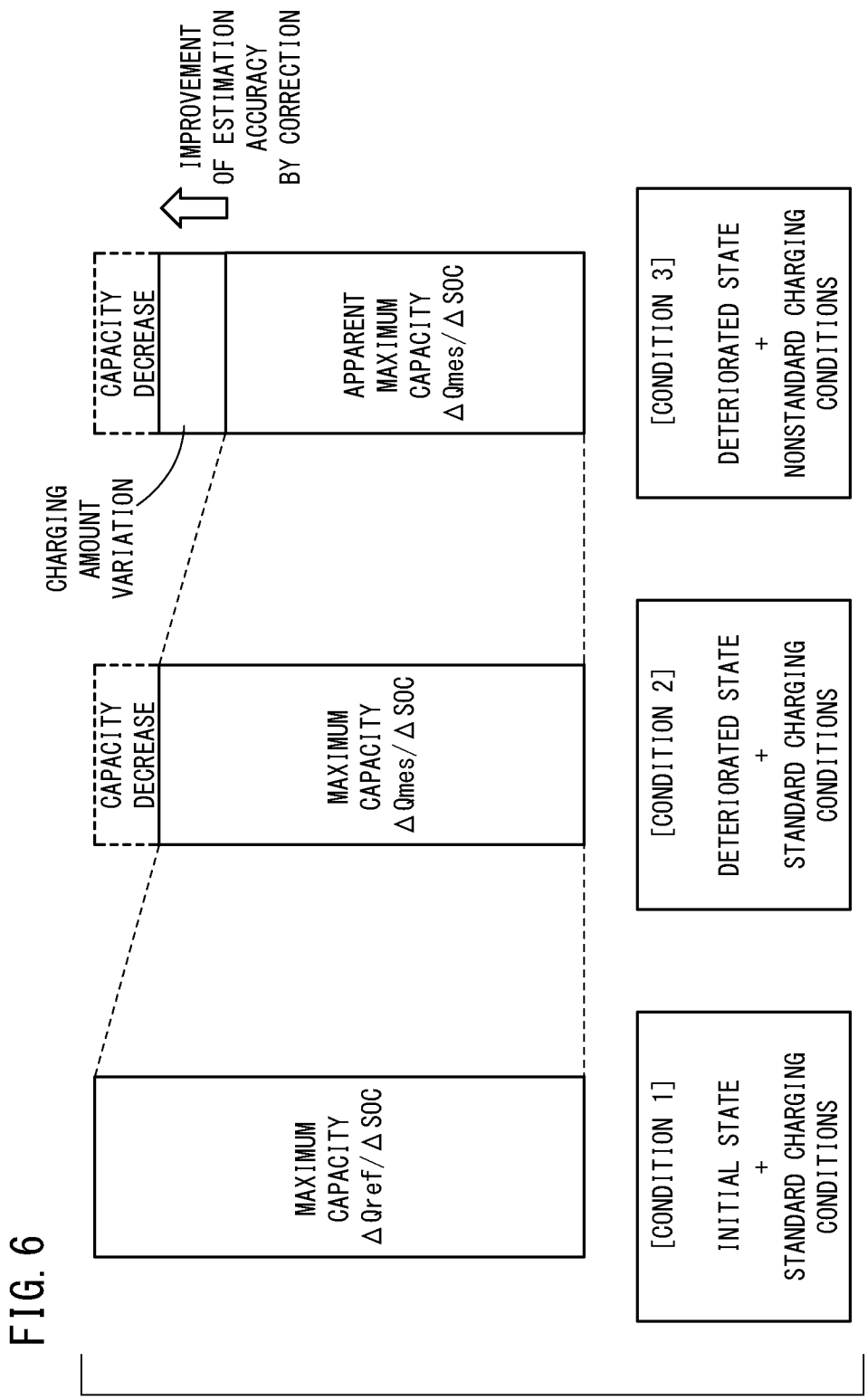
FIG. 6 is a schematic diagram used to explain the outlines of an estimation model.

FIG. 6 is a schematic diagram used to explain the outlines of the estimation model. The bar graphs in this diagram represent volumes of capacity of the electric storage unit 30. [Condition 1] corresponds to a case where a brand-new electric storage unit 30 is charged under the standard charging conditions. [Condition 2] corresponds to a case where a deteriorated electric storage unit 30 is charged under the standard charging conditions. [Condition 3] corresponds to a case where a deteriorated electric storage unit 30 is charged under nonstandard charging conditions.

As can be seen by comparing the conditions 1 and 2, the maximum capacity Qmax decreases by "capacity decrease" (shown by broken line) due to deterioration of performance of the electric storage unit 30. As can be seen by comparing the conditions 2 and 3, the maximum capacity Qmax varies ("decreases" in this example) by "charging amount variation" due to deviation of (differences in) charging conditions.

Now, when comparing the conditions 1 and 3, specifically, determining the state of deterioration of the electric storage unit 30 from the relationship with the maximum capacity (reference value) obtained when the brand-new electric storage unit 30 is charged under the standard charging conditions encounters a problem that the accuracy of determination of deterioration varies. As such, in the condition 3, the estimation model is determined considering the variation caused by the differences in charging conditions.

This mathematical model is expressed by equation (1), where the maximum capacity is regarded as a function Q(T, I, V1, V2) of the condition variables and Taylor expansion of the function Q is performed around the standard charging conditions.

$$Q(T, I, V1, V2) = Q(T_{std}, I_{std}, V1_{std}, V2_{std}) + \frac{\partial Q}{\partial T}(T - T_{std}) + \frac{\partial Q}{\partial I}(I - I_{std}) + \frac{\partial Q}{\partial V1}(V1 - V1_{std}) + \frac{\partial Q}{\partial V2}(V2 - V2_{std}) + \ldots \quad (1)$$

The first term on the right-hand side of equation (1) corresponds to the maximum capacity Qmax under the standard charging conditions. The second term on the right-hand side of the equation corresponds to a first-order (linear) correction term by temperature T. The third term on the right-hand side of the equation corresponds to a first-order correction term by current I. The fourth term on the right-hand side of the equation corresponds to a first-order correction term by starting voltage V1. The fifth term on the right-hand side of the equation corresponds to a first-order correction term by ending voltage V2.

For example, assuming that each deviation is a linear term (first-degree term) of small quantity, the right-hand side of equation (1) consists only of the five terms shown above. In this case, temperature correction coefficient At, current correction coefficient Ac, starting voltage correction coefficient Av1, and ending voltage correction coefficient Avg are calculated by equations (2) to (5) below.

$$A_t = \frac{\partial}{\partial T}Q(T_{std}, I_{std}, V1_{std}, V2_{std}) \quad (2)$$

$$A_c = \frac{\partial}{\partial I}Q(T_{std}, I_{std}, V1_{std}, V2_{std}) \quad (3)$$

$$A_{v1} = \frac{\partial}{\partial V1}Q(T_{std}, I_{std}, V1_{std}, V2_{std}) \quad (4)$$

$$A_{v2} = \frac{\partial}{\partial V2}Q(T_{std}, I_{std}, V1_{std}, V2_{std}) \quad (5)$$

At step S4, the working computer 28 collects test data that was obtained by a constant current-constant voltage (CC-CV) charging test of the electric storage unit 30. For example, the test data corresponds to data that is obtained by the measurement sensor 32 by performing a CC-CV charging test of the electric storage unit 30 through a given sequence control, with the removable battery 14 being connected to a charging and discharging test device (not shown).

At step S5, the working computer 28 analyzes the test data collected at step S4 so as to calculate the capacity deviation ΔQref and state-of-charge deviation ΔSOC of the brand-new electric storage unit 30.

Figure 7:
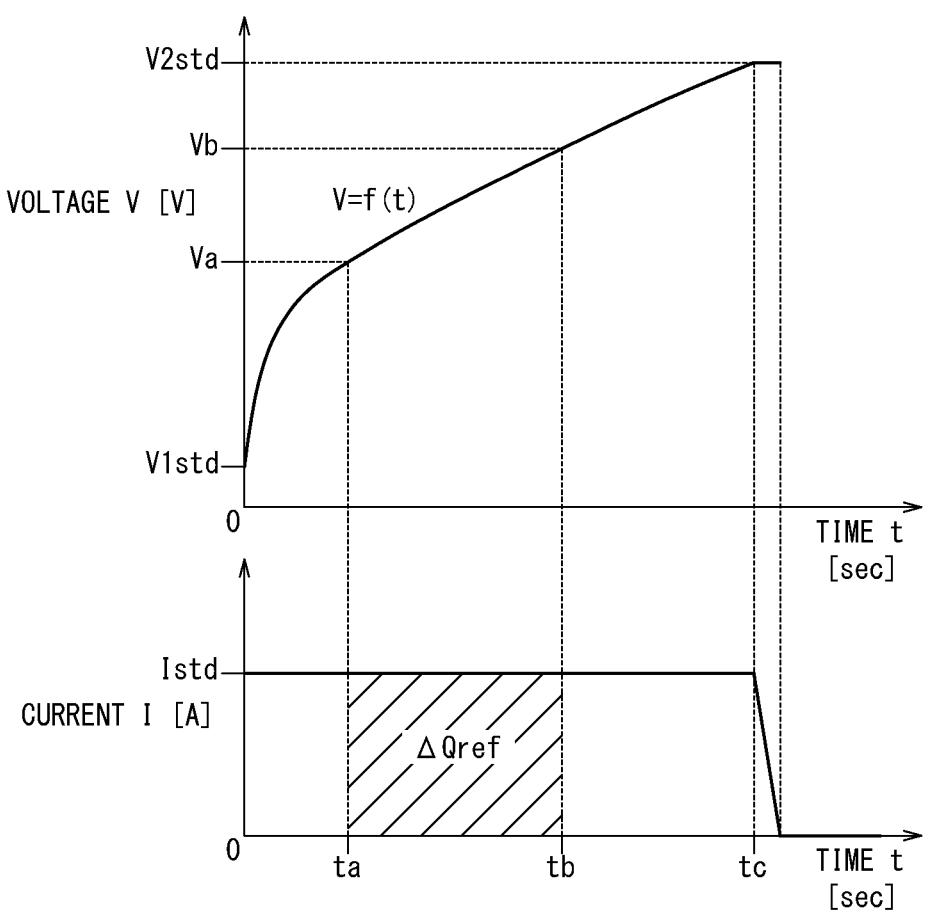
FIG. 7 is a schematic diagram used to explain a method for calculating a capacity deviation being an object of reference.

FIG. 7 is a schematic diagram used to explain a method for calculating the capacity deviation ΔQref as an object of reference. The upper part of FIG. 7 is a graph showing time variation of voltage V (unit: V) in CC-CV charging under the standard charging conditions. The lower part of FIG. 7 is a graph showing time variation of current I (unit: A) in CC-CV charging under the standard charging conditions. The upper graph may hereinafter be expressed as V=f(t).

This function f(t) has such a curve shape that the value of the function f(t) increases rapidly (convexly upward) in the range of t=0 to ta and increases linearly in the range of t=ta to tc. For example, the voltage range V=Va to Vb having high linearity is set in advance. This voltage range corresponds to the time range t=ta to tb (where tb<tc).

Then, the capacity deviation ΔQref is calculated by time integration of the current I in the range t=ta to tb in the graph in the lower part. In this case, since the CC charging is performed under the standard charging conditions, the current I is constant (I=Istd) regardless of time t. That is, the capacity deviation ΔQref is calculated substantially using equation (6) below.

$$\Delta Q\text{ref} = I_{std}(tb - ta) \quad (6)$$

Figure 8:
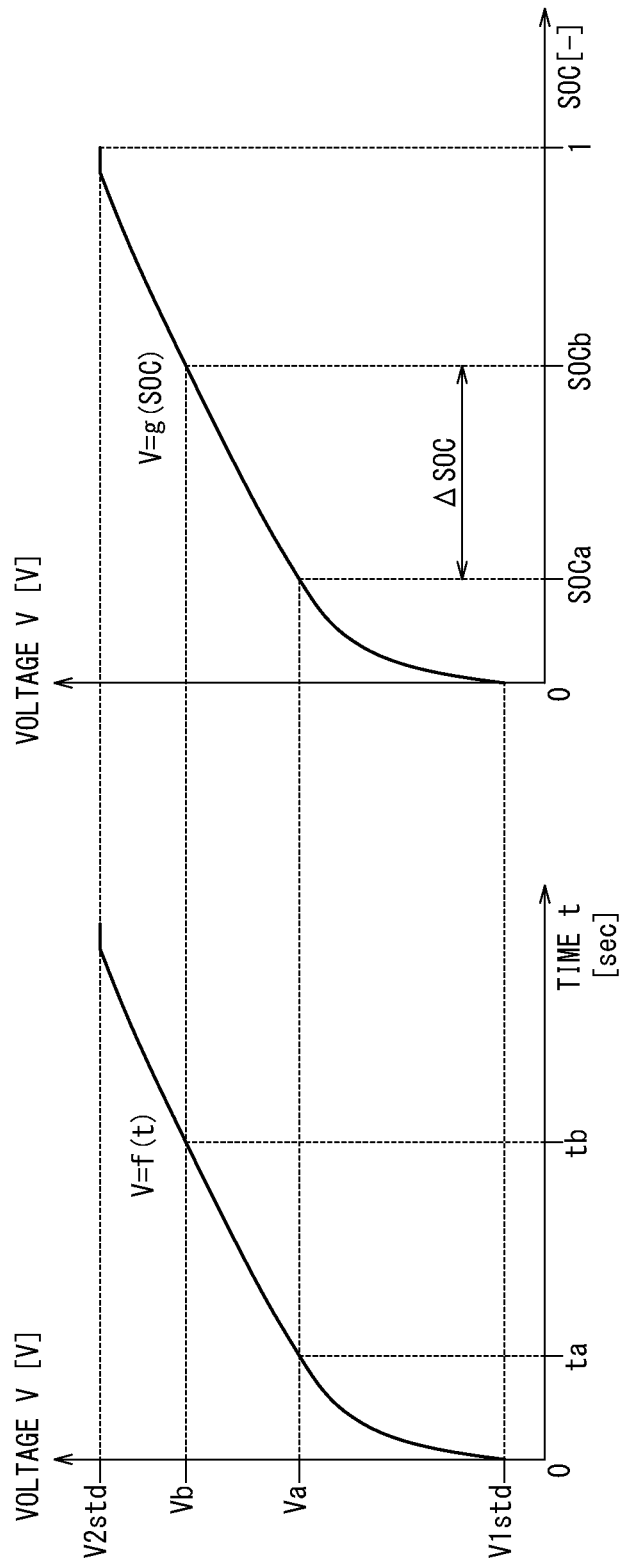
FIG. 8 is a schematic diagram used to explain a method for calculating a state-of-charge deviation being an object of reference.

FIG. 8 is a schematic diagram used to explain a method for calculating the state-of-charge deviation ΔSOC as an object of reference. The left side in FIG. 8 is the same graph as that in the upper part of FIG. 7 (i.e., time variation of voltage V). The right side of FIG. 8 is a graph showing a relationship between SOC (dimensionless) and voltage V in the CC charging using the standard charging conditions. The graph on the right side may hereinafter be expressed as V=g(SOC).

Now, in the graph on the right side, the value of SOC that corresponds to V=Va=f(ta) is defined as "SOCa" and the value of SOC that corresponds to V=Vb=f(tb) is defined as "SOCb". Then, the state-of-charge deviation ΔSOC is calculated using equation (7) below.

$$\Delta SOC = SOC_b - SOC_a = g^{-1} \cdot f(tb) - g^{-1} \cdot f(ta) \quad (7)$$

At step S6, the working computer 28 analyzes the experimental data collected at step S5 and calculates the four kinds of correction coefficients for the brand-new electric storage unit 30.

Figure 9A:
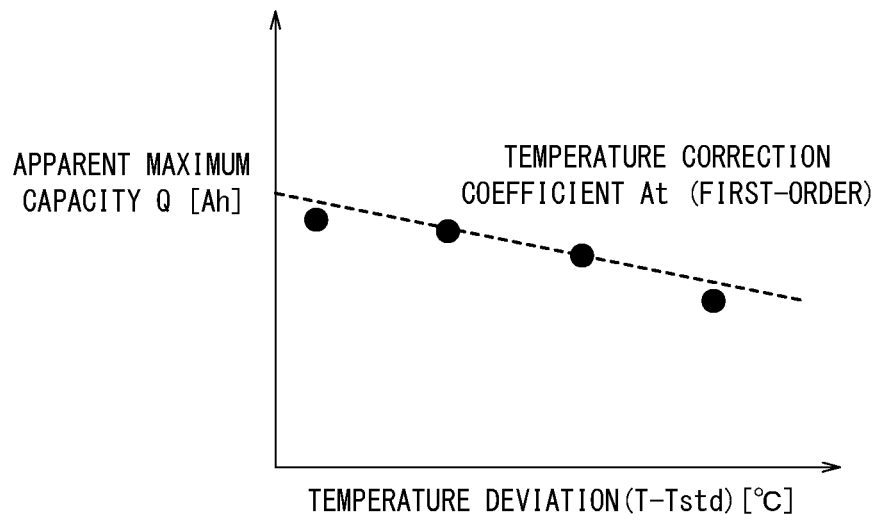
FIG. 9A is a schematic diagram used to explain a method for calculating a temperature correction coefficient.

FIG. 9A is a schematic diagram used to explain a method for calculating the temperature correction coefficient At. The horizontal axis of this graph shows temperature deviation (T−Tstd) (unit: ° C.) and the vertical axis of the graph shows an apparent maximum capacity Q (unit: Ah). This diagram corresponds to a graph obtained by plotting the results of actual measurement of the apparent maximum capacity Q while varying the temperature T within a control range including the temperature Tstd.

As can be seen from this diagram, the apparent maximum capacity Q tends to decrease substantially linearly with increasing temperature T. Hence, the working computer 28 obtains an approximate straight line from the multiple, plotted data by using various regression analysis methods and calculates the gradient of the straight line as the temperature correction coefficient At.

Figure 9B:
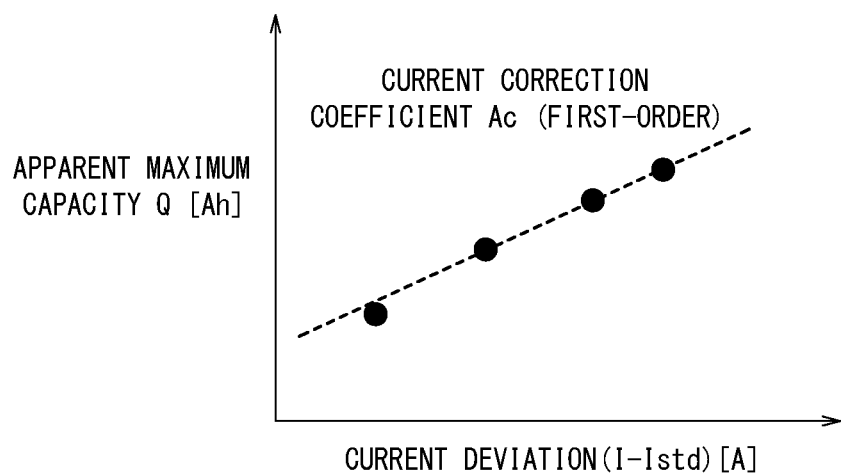
FIG. 9B is a schematic diagram used to explain a method for calculating a current correction coefficient.

FIG. 9B is a schematic diagram used to explain a method for calculating the current correction coefficient Ac. The horizontal axis of this graph shows current deviation (I−Istd) (unit: A) and the vertical axis of the graph shows the apparent maximum capacity Q (unit: Ah). This diagram corresponds to a graph obtained by plotting the results of actual measurement of the apparent maximum capacity Q while varying the current I within a control range including the current Istd.

As can be seen from this diagram, the apparent maximum capacity Q tends to increase substantially linearly with increasing current I. Hence, the working computer 28 obtains an approximate straight line from the multiple, plotted data by using various regression analysis methods and calculates the gradient of the straight line as the current correction coefficient Ac.

Figure 10A:
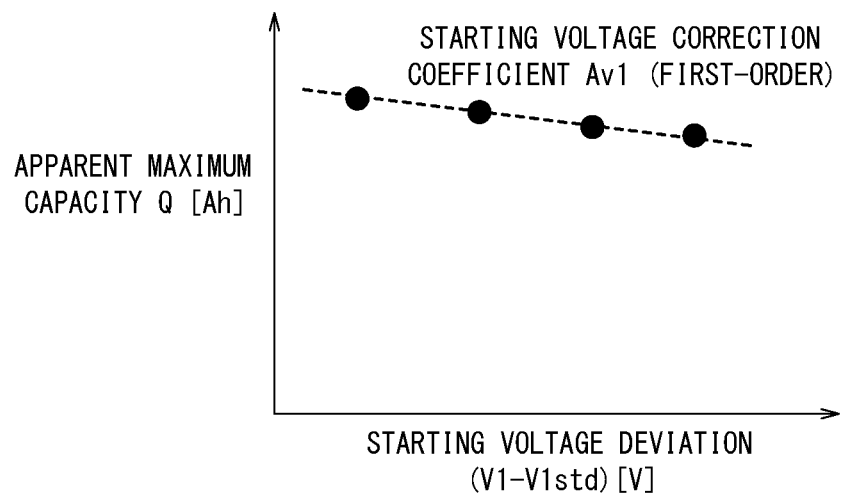
FIG. 10A is a schematic diagram used to explain a method for calculating a starting voltage correction coefficient.

FIG. 10A is a schematic diagram used to explain a method for calculating the starting voltage correction coefficient Av1. The horizontal axis of this graph shows starting voltage deviation (V1−V1std) (unit: V) and the vertical axis of the graph shows the apparent maximum capacity Q (unit: Ah). This diagram corresponds to a graph obtained by plotting the results of actual measurement of the apparent maximum capacity Q while varying the starting voltage V1 within a control range including the starting voltage V1std.

As can be seen from this diagram, the apparent maximum capacity Q tends to decrease substantially linearly with increasing starting voltage V1. The working computer 28 obtains an approximate straight line from the multiple, plotted data by using various regression analysis methods and calculates the gradient of the straight line as the starting voltage correction coefficient Av1.

Figure 10B:
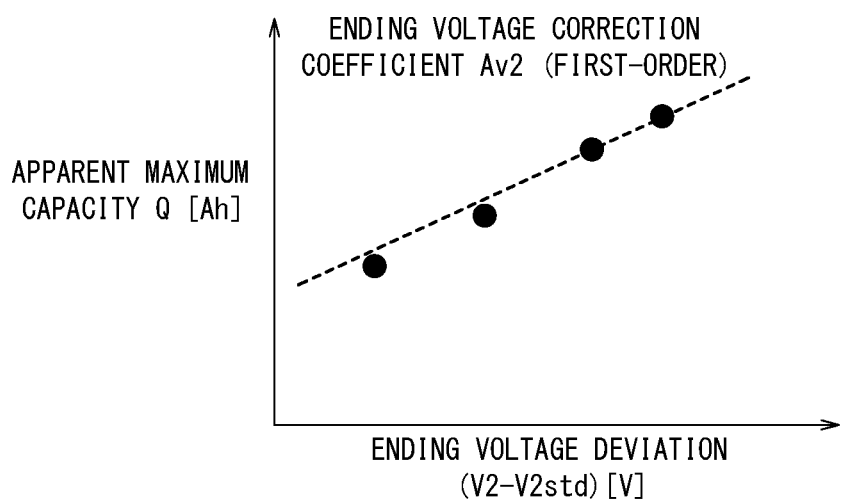
FIG. 10B is a schematic diagram used to explain a method for calculating an ending voltage correction coefficient.

FIG. 10B is a schematic diagram used to explain a method for calculating the ending voltage correction coefficient Avg. The horizontal axis of this graph shows ending voltage deviation (V2−V2std) (unit: V) and the vertical axis of the graph shows the apparent maximum capacity Q (unit: Ah). This diagram corresponds to a graph obtained by plotting the results of actual measurement of the apparent maximum capacity Q while varying the ending voltage V2 within a control range including the ending voltage V2std.

As can be seen from this diagram, the apparent maximum capacity Q tends to increase substantially linearly with increasing ending voltage V2. Hence, the working computer 28 obtains an approximate straight line from the multiple, plotted data by using various regression analysis methods and calculates the gradient of the straight line as the ending voltage correction coefficient Avg.

At step S7, the working computer 28 transmits the information on the removable battery 14 obtained through the series of operations of steps S1 to S6 (specifically, battery ID, battery type, standard charging conditions, and capacity estimation information) to the management server 18 through the network NW.

Then, the server-side control unit 62 (here, the data processing unit 72) receives the various information through the server-side communication unit 60 and stores the information in the server-side storage unit 64 as part of the battery performance information 76 (FIG. 4). The preparation for capacity estimation processing (the flowchart of FIG. 5) thus ends.

<Contents of Capacity Estimation Processing>

Next, the processing of estimating the capacity of the electric storage unit 30 will be described in detail while referring to the flowchart of FIG. 11. It is assumed here that the capacity estimation processing is performed after the removable battery 14 has been returned.

At step S11, the control device 44 of the charging station 16 (i.e., the charging control unit 46) checks whether a used battery 14u has been loaded into a vacant charger 26. For example, the charging control unit 46 checks to see whether a communicable state with a used battery 14u has been established by connection of the connection units 36 and 52.

When the loading is not confirmed (step S11: NO), the process stays at step S11 until a used battery 14u is loaded. On the other hand, when the loading is confirmed (step S11: YES), the process moves to the next step S12.

In step S12, the control device 44 (here, the charging control unit 46) performs a CC charging control for the electric storage unit 30 of the used battery 14u that has been loaded at step S11. During the CC charging, the billing amount calculation unit 50 may obtain the amount of electric power used by the recharged battery 14c and calculate the billing amount corresponding to the amount of electric power used.

Here, if the charging of the electric storage unit 30 is performed in an environment that is different from the intended usage environment, then the actual charging conditions may differ from the standard charging conditions to a nonnegligible extent. Such a case includes a situation where the ambient temperature of the removable battery 14 or the charging station 16 is higher than expected.

At step S13, the server-side control unit 62 (here, the condition variable acquisition unit 66) of the management server 18 acquires actual charging conditions that have been measured by the measurement sensor 32, during the charging in step S12. Prior to the acquisition, the information acquisition unit 48 of the control device 44 acquires necessary information from the BMU 34 through the connection units 36 and 52, where the necessary information includes battery ID and measurement data that enables the actual charging conditions to be specified (time-series data on temperature T, current I, and voltage V).

Subsequently, the control device 44 transmits the data to the management server 18 through the communication module 40 and the network NW, with the acquired actual charging conditions and battery ID being associated with each other. The condition variable acquisition unit 66 analyzes the measurement data from the charging station 16 to thereby acquire the actual charging conditions (i.e., temperature Tmes, current Imes, starting voltage V1mes, and ending voltage V2mes).

At step S14, the condition variable acquisition unit 66 reads desired battery performance information 76 from the server-side storage unit 64. More specifically, the condition variable acquisition unit 66 acquires information that corresponds to the already acquired actual charging conditions (i.e., the standard charging conditions and capacity estimation information) using the battery ID acquired at step S13 as a search key.

At step S15, the server-side control unit 62 (here, the capacity estimation unit 68) calculates and estimates the maximum capacity Qmax of the electric storage unit 30 by using the actual charging conditions acquired at step S13 and the standard charging conditions and capacity estimation information acquired at step S14.

Figure 12:
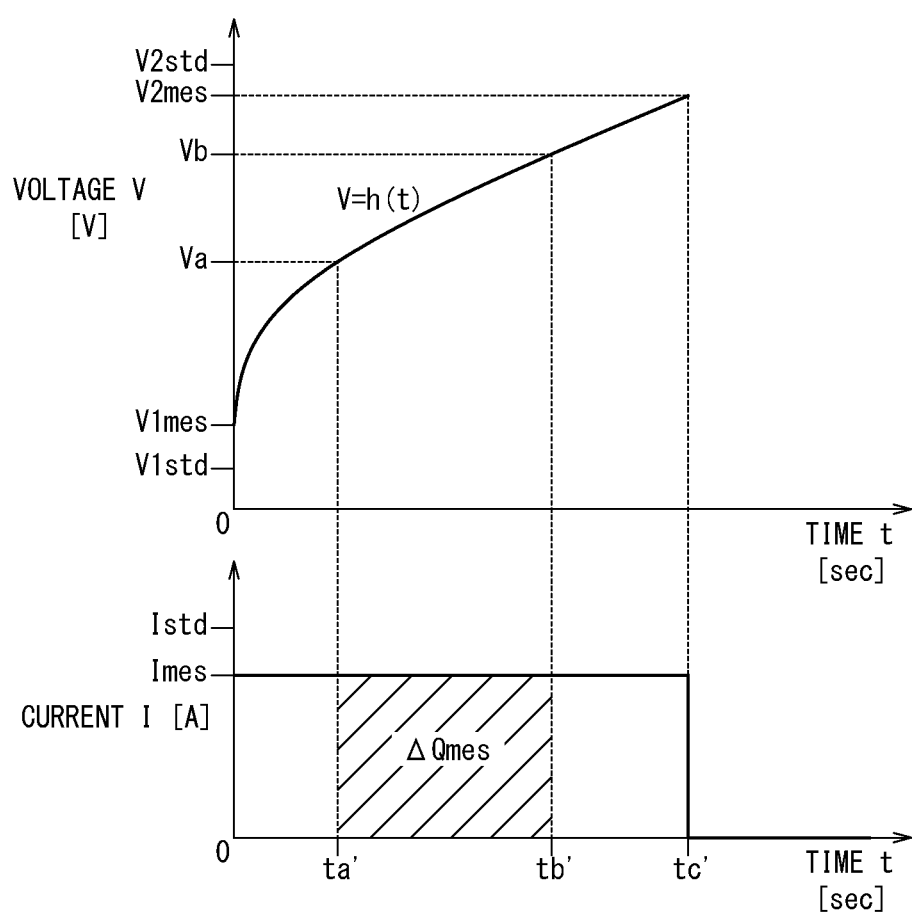
FIG. 12 is a schematic diagram used to explain a method for calculating a capacity deviation being an object of measurement.

FIG. 12 is a schematic diagram used to explain a method for calculating the capacity deviation ΔQmes as an object of measurement. The upper part of FIG. 12 is a graph showing time variation of the voltage V (unit: V) during CC charging using the actual charging conditions. The lower part of FIG. 12 is a graph showing time variation of the current I (unit: A) during the CC charging using the actual charging conditions. The graph in the upper part may hereinafter be represented as V=h(t).

This function h(t) has such a curve shape that the value of the function h(t) increases rapidly (convexly upward) in the range of t=0 to ta' and increases linearly in the range of t=ta' to tc'. However, because of performance deterioration of the electric storage unit 30 and differences in the charging conditions, the curve shape is different from that of f(t) of FIG. 7. It is assumed herein that Va=h(ta'), Vb=h(tb'), and V2mes=h(tc') are satisfied.

Like the capacity deviation ΔQref obtained in FIG. 7, the capacity deviation ΔQmes is calculated by time integration of the current I in the graph in the lower part in the range of t=ta' to tb'. Here, the CC charging is performed under the actual charging conditions and so the current I is constant (I=Imes) regardless of time t. That is, the capacity deviation ΔQmes is calculated substantially using equation (8) below.

$$\Delta Q_{meas} = I_{mes}(tb' - ta') \qquad (8)$$

Then, the maximum capacity Qmax is calculated according to equation (9) by deforming the equations (1) to (5) shown above.

$$Q_{max} = \Delta Q_{meas}/\Delta SOC - At(T_{mes} - T_{std}) - Ac(I_{mes} - I_{std}) - Av1(V1_{mes} - V1_{std}) - Av2(V2_{mes} - V2_{std}) \qquad (9)$$

The first term on the right-hand side of equation (9) corresponds to the apparent capacity (ΔQmes/ΔSOC) calculated using a uniform calculation method irrespective of change in charging conditions. The second term on the right-hand side of the equation corresponds to a first-order correction term that is proportional to the temperature deviation (Tmes−Tstd). The third term on the right-hand side of the equation corresponds to a first-order correction term that is proportional to the current deviation (Imes−Istd). The fourth term on the right-hand side of the equation corresponds to a first-order correction term that is proportional to the starting voltage deviation (V1mes−V1std). The fifth term on the right-hand side of the equation corresponds to a first-order correction term that is proportional to the ending voltage deviation (V2mes−V2std).

While the capacity estimation unit 68 calculates the maximum capacity Qmax according to equation (9), the calculation equation or estimation model is not limited to this. For example, the calculation equation may be a polynomial concerning a deviation of at least one environmental condition.

At step S16, the performance evaluation unit 70 performs an evaluation as to whether the performance of the removable battery 14 is acceptable or not, on the basis of the maximum capacity Qmax estimated at step S15. For example, the performance evaluation unit 70 determines that "the battery is still usable" if the relationship Qmax≥Qth is satisfied, where Qth is a predetermined threshold. On the other hand, the performance evaluation unit 70 determines that "the battery is no longer usable" if the relationship Qmax<Qth is satisfied.

Subsequently, the server-side control unit 62 (here, the data processing unit 72) stores the battery evaluation information obtained through the series of operations at steps S13 to S16 in the server-side storage unit 64 as part of the battery performance information 76 (FIG. 4).

At step S17, the performance evaluation unit 70 determines whether the removable battery 14 has been determined to be still usable at step S16. If it is determined to be still usable (step S17: YES), the flowchart of FIG. 11 comes to an end directly. On the other hand, if it is determined to be no longer usable (i.e., not able to be used) (step S17: NO), the process moves to step S18.

At step S18, the charging station 16 provides the administrator of the charging station 16 with the information using an output device including the display device 22. Before providing the display, the performance evaluation unit 70 of the management server 18 transmits to the charging station 16 a notification signal indicating that continuous use of the removable battery 14 that was installed at step S11 is prohibited.

After that, the control device 44 generates display data representing visible information and outputs the data to the display device 22. In this way, in accordance with the visible information on the display device 22, the administrator can exclude the removable battery 14 with insufficient electric storage performance, from the charging station 16.

[Effects of Management Server 18]

As described so far, the management server 18 is a battery capacity estimation device configured to estimate the maximum capacity Qmax of the electric storage unit 30 (secondary battery) that has been charged under charging conditions that are specified by one or more condition variables, the management server 18 including: [1] the condition variable acquisition unit 66 configured to acquire standard variable values (Tstd, Istd, V1std, V2std) that indicate standard charging conditions for the electric storage unit 30 and measurement variable values (Tmes, Imes, V1mes, V2mes) that indicate actual charging conditions obtained by measurement; and [2] the capacity estimation unit 68 configured to estimate the maximum capacity Qmax from a relationship between the acquired standard variable values and measurement variable values. [3] The capacity estimation unit 68 calculates an apparent capacity (ΔQmes/ΔSOC) using a uniform calculation method irrespective of change in the charging conditions, and estimates the maximum capacity Qmax by adding, to the apparent capacity, correction quantities obtained by using deviations between the measurement variable values and the standard variable values.

Further, according to the battery capacity estimation method and program, one or a plurality of computers are configured to: [1] acquire standard variable values (Tstd, Istd, V1std, V2std) that indicate standard charging conditions for the electric storage unit 30 and measurement variable values (Tmes, Imes, V1mes, V2mes) that indicate actual charging conditions obtained by measurement (steps S13, S14); and [2] estimate the maximum capacity Qmax from a relationship between the acquired standard variable values and measurement variable values (step S15). [3] Step S15 calculates an apparent capacity (ΔQmes/ΔSOC) using a uniform calculation method irrespective of change in the charging conditions, and estimates the maximum capacity Qmax by adding, to the apparent capacity, correction quantities obtained by using deviations between the measurement variable values and the standard variable values.

In this way, it is possible to appropriately compensate variation of the maximum capacity Qmax that is due to the deviation of charging conditions and thus to estimate the maximum capacity of the electric storage unit 30 highly accurately.

The capacity estimation unit 68 may estimate the maximum capacity Qmax based on a calculation equation that is obtained by regarding the maximum capacity Qmax as a function of the condition variables (T, I, V1, V2) and performing Taylor expansion of the function around the standard variable values. Expressing the maximum capacity Qmax as a polynomial of deviations enables the maximum capacity Qmax to be estimated by relatively simple calculation.

The capacity estimation unit 68 may estimate the maximum capacity Qmax by adding first-order correction quantities that are proportional to the deviations between the measurement variable values and the standard variable values. It is possible to achieve high estimation accuracy even with a simplest calculation equation.

The condition variable may be at least one of temperature T, current I, starting voltage V1, and ending voltage V2. It is thus possible to acquire the condition variables by using the measurement sensor 32 that is generally provided to control charging and discharging of the electric storage unit 30.

The electric storage unit 30 may be a lithium-ion battery. Lithium-ion batteries have relatively high dependence on the environment as compared to batteries of other types, and therefore the above advantageous effects in correcting the variation becomes more remarkable.

[Supplement]

The present invention is not limited to the embodiments described above and can of course be freely modified in a range not departing from the essence and gist of the present invention. Or, the configurations may be arbitrarily combined in a range where no technical inconsistencies occur therein.

REFERENCE SIGNS LIST

10 electric power billing system
12 motorcycle
14 removable battery
14*c* recharged battery
14*u* used battery
16 charging station
18 management server (battery capacity estimation device)
26 charger
28 working computer
30 electric storage unit (secondary battery)
32 measurement sensor
34 BMU
44 control device
60 server-side communication unit
62 server-side control unit
64 server-side storage unit
66 condition variable acquisition unit
68 capacity estimation unit
70 performance evaluation unit
72 data processing unit
74 service usage information
76 battery performance information

What is claim is:

1. A battery capacity estimation device configured to estimate a maximum capacity of a secondary battery that has been charged under a charging condition that is specified by one or more condition variables, the device comprising:
    a condition variable acquisition unit configured to acquire a standard variable value that indicates a standard charging condition for the secondary battery and a measurement variable value that indicates an actual charging condition obtained by measurement; and
    a capacity estimation unit configured to estimate the maximum capacity from a relationship between the standard variable value and the measurement variable value acquired by the condition variable acquisition unit,
    wherein the capacity estimation unit calculates an apparent capacity using a uniform calculation method irrespective of change in the charging condition, and estimates the maximum capacity by adding, to the apparent capacity, a correction quantity obtained by using a deviation between the measurement variable value and the standard variable value.

2. The battery capacity estimation device according to claim 1, wherein the capacity estimation unit estimates the maximum capacity based on a calculation equation that is obtained by regarding the maximum capacity as a function of the condition variable and performing a Taylor expansion of the function around the standard variable value.

3. The battery capacity estimation device according to claim 1, wherein the capacity estimation unit estimates the maximum capacity by adding a first-order correction quantity that is proportional to the deviation between the measurement variable value and the standard variable value.

4. The battery capacity estimation device according to claim 1, wherein the condition variable is at least one of a temperature, a current, a starting voltage, and an ending voltage.

5. The battery capacity estimation device according to claim 1, wherein the secondary battery is a lithium-ion battery.

6. A battery capacity estimation method for estimating a maximum capacity of a secondary battery that has been charged under a charging condition that is specified by one or more condition variables,
    wherein one or a plurality of computers are configured to execute:
    an acquisition step of acquiring a standard variable value that indicates a standard charging condition for the secondary battery and a measurement variable value that indicates an actual charging condition obtained by measurement; and
    an estimation step of estimating the maximum capacity from a relationship between the acquired standard variable value and the acquired measurement variable value,
    wherein the estimation step calculates an apparent capacity using a uniform calculation method irrespective of change in the charging condition, and estimates the maximum capacity by adding, to the apparent capacity, a correction quantity obtained by using a deviation between the measurement variable value and the standard variable value.

7. A non-transitory computer readable storage medium storing a battery capacity estimation program for estimating a maximum capacity of a secondary battery that has been charged under a charging condition that is specified by one or more condition variables, wherein the program causes one or a plurality of computers to execute:

an acquisition step of acquiring a standard variable value that indicates a standard charging condition for the secondary battery and a measurement variable value that indicates an actual charging condition obtained by measurement; and an estimation step of estimating the maximum capacity from a relationship between the acquired standard variable value and the acquired measurement variable value, wherein the estimation step calculates an apparent capacity using a uniform calculation method irrespective of change in the charging condition, and estimates the maximum capacity by adding, to the apparent capacity, a correction quantity obtained by using a deviation between the measurement variable value and the standard variable value.

* * * * *